United States Patent

Helda

[15] 3,698,073

[45] Oct. 17, 1972

[54] CONTACT BONDING AND PACKAGING OF INTEGRATED CIRCUITS

[72] Inventor: Robert W. Helda, Hollywood, Fla.

[73] Assignee: Motorola, Inc., Franklin Park, Ill.

[22] Filed: Oct. 13, 1970

[21] Appl. No.: 80,378

Related U.S. Application Data

[63] Continuation of Ser. No. 691,041, Dec. 15, 1967, abandoned, which is a continuation of Ser. No. 691,040, Dec. 15, 1967, abandoned.

[52] U.S. Cl. ........................29/577, 29/588, 29/591, 29/627, 174/DIG. 3

[51] Int. Cl. ............................B01j 17/00, H011 1/16

[58] Field of Search.....29/577, 589, 590, 576 S, 591, 29/625, 626, 627, 471.1; 174/3 FP; 317/234 J, 234 N

[56] References Cited

UNITED STATES PATENTS

| | | | |
|---|---|---|---|
| 3,387,359 | 6/1968 | Dale et al. | 29/577 |
| 3,390,308 | 6/1968 | Marley | 317/100 |
| 3,390,450 | 7/1968 | Checki, Jr. et al | 29/589 |
| 3,404,319 | 10/1968 | Tsuji et al. | 317/234 |
| 3,436,810 | 4/1969 | Kauffman | 29/577 |
| 3,440,027 | 4/1969 | Hugle | 29/193.5 |
| 3,469,953 | 9/1969 | St. Clair et al. | 29/193.5 |
| 3,473,212 | 10/1969 | Beck et al. | 29/203 |
| 3,484,533 | 12/1969 | Kauffman | 174/52 |
| 3,494,024 | 2/1970 | Bock et al. | 29/589 |
| 3,497,947 | 3/1970 | Ardezzone | 29/577 |
| 3,262,022 | 7/1966 | Caracciolo | 317/101 |
| 3,264,712 | 8/1966 | Hayashi et al. | 29/155.5 |
| 3,270,399 | 9/1966 | Ohntrup | 29/155.5 |
| 3,271,625 | 9/1966 | Caracciolo | 317/101 |
| 3,303,393 | 2/1967 | Hymes et al. | 317/101 |
| 3,312,540 | 4/1967 | Plumbo et al. | 65/59 |
| 3,317,287 | 5/1967 | Caracciolo | 29/193 |
| 3,341,649 | 9/1967 | James | 174/52 |
| 3,374,537 | 3/1968 | Doelp, Jr. | 29/627 |
| 3,381,372 | 5/1968 | Capano | 29/627 |
| 3,382,564 | 5/1968 | Gallentine | 29/471.1 |
| 2,457,616 | 12/1948 | Van Dyke et al. | 201/63 |
| 2,613,252 | 10/1952 | Heibel | 175/298 |
| 2,953,840 | 9/1960 | Freeburg | 29/25.42 |
| 3,050,186 | 8/1962 | Niles | 206/59 |
| 3,057,047 | 10/1962 | Zimmer | 29/155.55 |
| 3,080,640 | 3/1963 | Jochems | 29/155.55 |
| 3,102,331 | 9/1963 | Da Costa | 29/203 |
| 3,159,128 | 12/1964 | Kodey, Jr. | 113/129 |
| 3,171,187 | 3/1965 | Ikeda et al. | 29/25.3 |
| 3,195,026 | 7/1965 | Wegner et al. | 317/234 |
| 3,255,511 | 6/1966 | Weissenstern et al. | 29/155.5 |
| 3,517,438 | 6/1970 | Johnson et al. | 29/627 |
| 3,550,262 | 12/1970 | Putter et al. | 29/591 |
| 3,553,828 | 1/1971 | Starger | 29/589 |
| 3,577,633 | 5/1971 | Homma et al. | 29/588 |
| 3,426,423 | 2/1969 | Koch et al. | 29/574 |
| 3,469,684 | 9/1969 | Keady et al. | 206/59 |

FOREIGN PATENTS OR APPLICATIONS

| | | |
|---|---|---|
| 782,035 | 8/1957 | Great Britain |
| 1,015,909 | 1/1966 | Great Britain |
| 1,240,961 | 5/1967 | Germany |

OTHER PUBLICATIONS

IBM Technical Disclosure Bulletin, Vol. 10, No. 7, December 1967 Article entitled Chip Mounting Technique by F. G. Grisely, p. 1058

Proceedings I.R.E.E. Australia, May 1968, article entitled The Process Steps for Integrated Circuits and Their Relation to Customer Requirements by J. C. Van Vessem, pps. 170- 176.

*Primary Examiner*—John F. Campbell
*Assistant Examiner*—W. Tupman
*Attorney*—Mueller and Aichele

[57] ABSTRACT

Wire bonding is eliminated in the assembly of microelectronic devices, by a process involving the direct bonding of circuit electrodes to a metallic sheet-frame member having a plurality of inwardly extending leads. A single-step bonding technique is employed for the simultaneous bonding of all leads to a semiconductor integrated circuit chip. Lateral confinement of the lead frame member during the bonding steps causes a buckling action in the lead fingers, to introduce a small but critical loop in each lead to ensure clearance between the lead fingers and the perimeter of the semiconductor chip, whereby electrical shorting is avoided. The loop also provides a structural flexibility in the leads, which tends to protect the bonding sites from excessive stresses. Subsequently, the first frame member including the bonded circuit is attached, preferably by resistance welding, to a second lead frame member of heavier gage and increased dimensions, suitable for connection with external circuitry. Excess portions of the first frame member are then removed, providing a completed assembly for packaging; e.g., plastic encapsulation or heremetic sealing, as in a ceramic-glass flat package.

20 Claims, 10 Drawing Figures

CONTACT BONDING AND PACKAGING OF INTEGRATED CIRCUITS

This is a continuation application for CONTACT BONDING AND PACKAGING OF INTEGRATED CIRCUITS by Robert W. Helda, filed Dec. 15, 1967, Ser. No. 691,041, now abandoned, and is related to the continuation application of Robert W. Helda and Harry Geyer, Ser. No. 56,081 filed June 29, 1970, which is a continuation of an application filed Dec. 15, 1967 as Ser. No. 691,040, and now abandoned.

The invention of this application is related to inventions owned by Motorola, Inc., the assignee of this application, and covered in U.S. Pat. Nos. 3,413,713 issued Dec. 3, 1968; 3,444,441 issued May 13, 1969; 3,531,856 issued Oct. 6, 1970; and 3,611,061 issued Oct. 5, 1971.

BACKGROUND

This invention relates to the assembly and packaging of microelectronic devices, including particularly the contact bonding and assembly of integrated semiconductor circuits.

Various methods have been proposed for providing electrical connections between the ohmic-contact areas of an integrated microcircuit and the external package leads. The most common method in current use involves the thermocompression bonding of extremely fine wires to the points to be interconnected. In accordance with this technique, a 14-lead device, for example, requires 28 separate bonding steps, each requiring a careful positioning of the partially assembled device in the bonding apparatus.

The industry has recognized for some time that it would be desirable to eliminate the time and expense of wire bonding. Considerable attention has been devoted to the expedient of simply extending the internal portions of the package leads and tapering the lead ends to provide bonding tips which are small enough for attachment directly to the bonding pads of the semiconductor structure. This approach has not been successful, primarily due to the fundamental difference in structural specifications required for external package leads as compared with the specifications required of internal leads bonded to the ohmic-contact areas of a microcircuit.

For example, the use of external package leads made of 10-mil Kovar has become a standard practice for many devices. Efforts to bond 10-mil Kovar leads directly to the electrodes of an integrated circuit have proved disappointing. High-speed techniques for gold or aluminum wire bonding, such as thermocompression bonding an vibratory pressure welding, do not readily produce a reliable bond when applied to leads as thick as 10-mils, or when applied to metal leads which are less ductile than gold, aluminum, or copper, for example. Even when acceptable bonds are initially formed using a 10-mil lead frame, the leads are very susceptible to inadvertent detachment from the die as a result of subsequent stresses introduced by normal handling and incidental flexing of the assembly.

It has also been proposed to replace bonding wires with individual rigid metal clips for interconnecting the bonding pads of the semiconductor circuit with the external leads. This approach may be advantageous for some applications, but it has not been found to reduce the cost of assembly substantially.

THE INVENTION

It is an object of the invention to provide an improved method for the manufacture of microelectronic devices. More particularly, it is an object of the invention to provide an improved method for contact-bonding and packaging of an integrated circuit structure.

It is a further object of the invention to provide a new approach to the problem of electrically connecting the ohmic-contact pads of an integrated circuit with the external lead wires of the packaged device. More particularly, it is a further object of the invention to provide a bonding method for the simultaneous bonding of all lead members to the contact pads in a single step.

A primary feature of the invention is the use of first and second electrically conductive, substantially flat sheet-frame members having a plurality of inwardly extending fingers or leads. The first lead frame member is the relatively smaller and lighter of the two, the plurality of inwardly extending lead ends thereof being adapted for alignment with and bonding to the electrode pads of an integrated circuit structure. The second lead frame member is larger and heavier than the first, being constructed of a material well suited for use as the external leads of a packaged device. The plurality of inwardly extending leads of the second frame member terminates in a pattern adapted for alignment with and bonding to the respective leads of the first frame member at points generally located outside the periphery of the integrated circuit structure.

Another feature of the invention is the simultaneous bonding of all lead terminals of the first frame member to the corresponding electrode pads of the circuit structure in a single step. The bonding is achieved by positioning the lead frame and the circuit die in proper alignment, i.e., with each lead terminal in contact with a corresponding circuit bonding pad, and then applying bonding energy simultaneously to all bonding sites. Specific bonding techniques which may be used include soldering, brazing, resistance welding, and thermocompression bonding. A particularly suitable method is to form a pressure weld by applying compressive force in combination with high-frequency vibrations to form mechanical bonds or welds. Such a bonding technique, per se, is well known. However, its practice in the industry has involved the bonding of one wire at a time, similarly as in the case of the thermocompression bonding mentioned above.

An additional feature of the invention relates to the buckling or looping of the leads of the first frame member during the bonding operation, accomplished by a lateral confinement of the frame member. Since the preferred bonding step involves a substantial deformation of the lead terminals, axial or longitudinal stress is introduced along the lead elements, sufficient to cause a significant buckling of the leads in the direction of minimum resistance. A clearance is thereby provided between the leads and the edges of the circuit chip, which avoids the danger of electrical shorting.

In accordance with a more specific aspect of this feature of the invention, the buckling may be substantially enhanced by providing a short segment of reduced cross section in each lead at some point near the edge of the circuit chip. The buckling action introduces a small permanent loop in each lead providing a structural flexibility which tends to relieve the bonding sites of excessive inadvertent stresses.

The invention is embodied in a method for contact bonding and packaging of an integrated circuit structure, including the use of an electrically conductive, substantially flat first frame member having a plurality of inwardly extending fingers or leads adapted for alignment with and bonding to the electrodes of the integrated circuit. Typically, the first lead frame member is prepared from sheet aluminum or copper having a tensile strength of 10,000 to 24,000 p.s.i. and a thickness of about 1.5 to 4.0 mils, preferably about 2 mils. Other metals may be employed. The exact configuration of the leads may suitably be provided by chemical etching or mechanical stamping procedures well known in the art of metal fabrication. Advantageously, an elongated rectangular strip is provided which includes a plurality of identical frame members equally spaced along the length of the strip. The extreme flexibility of the first lead frame member permits it to be easily stored in the form of a continuous strip or belt wound on a spool, from which it is unwound for use as needed.

The method further includes the step of aligning and bonding the electrodes of the circuit die in contact with the leads of the first frame member by the application of compressive force and high-frequency vibrations. In accordance with a specific aspect of the invention, the bonding of all leads to the circuit die is completed in a single step. The preferred technique is to employ a bonding needle having a flat tip of an area sufficient to contact a major proportion of the area of the current die. The bonding needle is pressed against the reverse side of the circuit die with rigid support means provided on the face of the die to hold all the lead terminals in place on the bonding pads. In this manner the bonding energy is applied to the reverse side of the circuit chip and passes equally and simultaneously to all bonding sites. The bonding energy can instead be applied directly to the bonding sites by pressing the bonding needle toward the face of the circuit die, in contact with the lead ends. However, substantially improved results are obtained when applying the needle to the reverse side of the chip.

Bonding of the integrated circuit die to the leads of the first frame member is preferably carried out using automated equipment designed for operation on a lead frame supplied in continuous strip form, as mentioned above. The strip including the bonded die can then again be wound on a spool, if desired, for subsequent attachment to the second lead frame member. The degree of flexing which necessarily occurs during such an operation would impose sufficient stress upon the bonding sites to rupture a large percentage of the bonds, if a lead frame member having the stiffness required of external leads were used.

A second lead frame member is then provided, of relatively heavier gage and of larger dimensions than the first frame member, the second frame member also having a plurality of inwardly extending fingers or leads. The leads of the second frame member provide the external electrical connections of the finally completed package. The terminals of the inwardly extending leads are adapted for alignment with some portion of each corresponding lead of the first frame member. The second frame member may be constructed of Kovar, nickel, copper, steel, or other suitable metal, and is also preferably provided in the form of an elongated rectangular strip consisting of a plurality of equally spaced, identical units. A thickness of 6 to 12 mils is generally required of the second frame member, and a tensile strength of at least 30,000 p.s.i.

The second frame member is then aligned in contact with the leads of the first frame member and corresponding leads are welded or otherwise attached to one another. Preferably a resistance weld is formed, with all of the leads being welded simultaneously by means of a cylindrical welding element, for example. Other suitable methods include soldering, brazing, thermocompression bonding, ultrasonic, etc.

After completion of the welding step, excess portions of the first frame member outside the peripheral weld points are removed. They may be accomplished, for example, by simply ripping away those portions of the first frame member which extend beyond the weld points, or the excess frame material may be cut with a cylindrical knife edge in a manner analogous to the operation of a cookie cutter. The assembly is then ready for plastic encapsulation or other packaging techniques.

A further embodiment includes the step of attaching rigid support means to the leads of the first frame member, spanning the circuit die structure to relieve the bonding sites of excessive stress in handling and molding operations prior to encapsulation. Typically the rigid support means comprises a ceramic disc or rectangular plate having a diameter or side, respectively, substantially greater than the major axis of the circuit die, and the leads of the frame member are attached to the ceramic disc by means of a polymeric adhesive. Advantageously, the adhesive is selected for its capacity to provide a passivating effect on the surface of the semiconductor structure, and is applied to an area of the ceramic plate sufficiently large to cover the semiconductor surface as well as the bonded leads, firmly binding the assembly to the ceramic support. The disc substantially improves life test stresses related to thermal cycling.

DRAWINGS

Figure 3A:
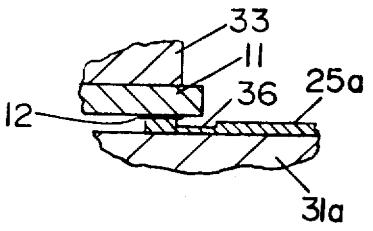
FIG. 3 is an elevational view in cross section, showing the simultaneously bonding of all lead elements of the first frame member to the corresponding bonding pads of a circuit die.

FIG. 3*a* is a fragmentary elevational view in cross section, showing an alternate embodiment for attaching the lead elements of the first frame member to the circuit die.

Figure 1:
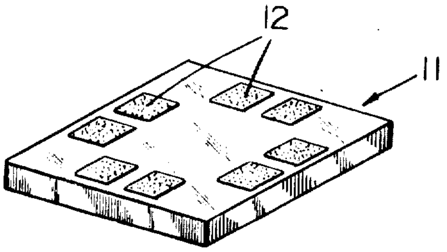
FIG. 1 is a greatly enlarged perspective view of an integrated circuit structure suitable for bonding and packaging in accordance with the invention.
Figure 4:
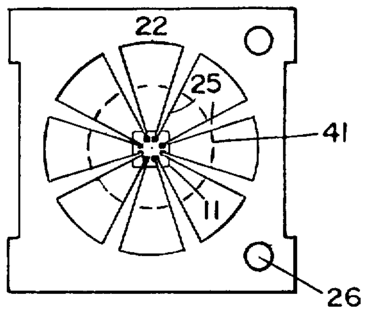

FIG. 4 is an enlarged plan view of the first frame member including the bonded circuit die of FIG. 1.

Figure 5:
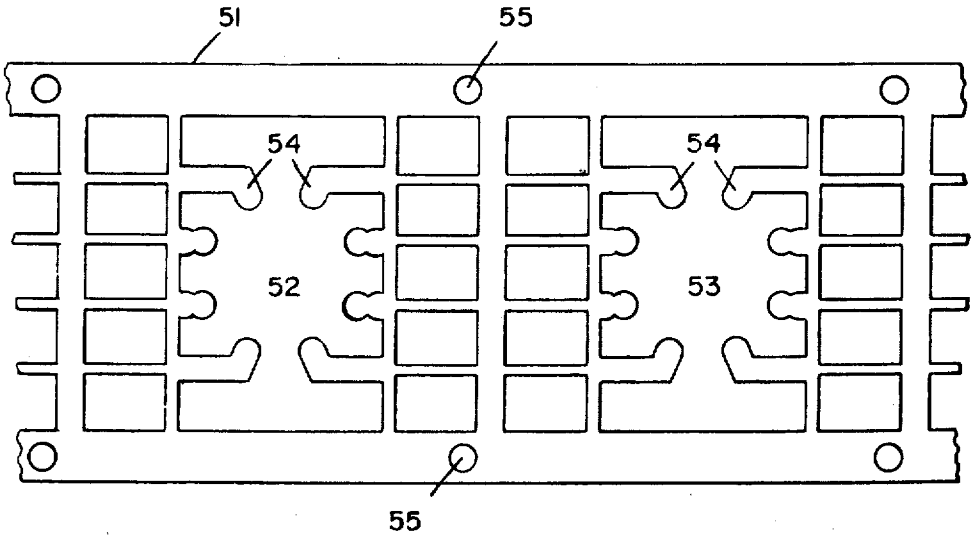

FIG. 5 is an enlarged plan view of the second lead frame member.

Figure 6:
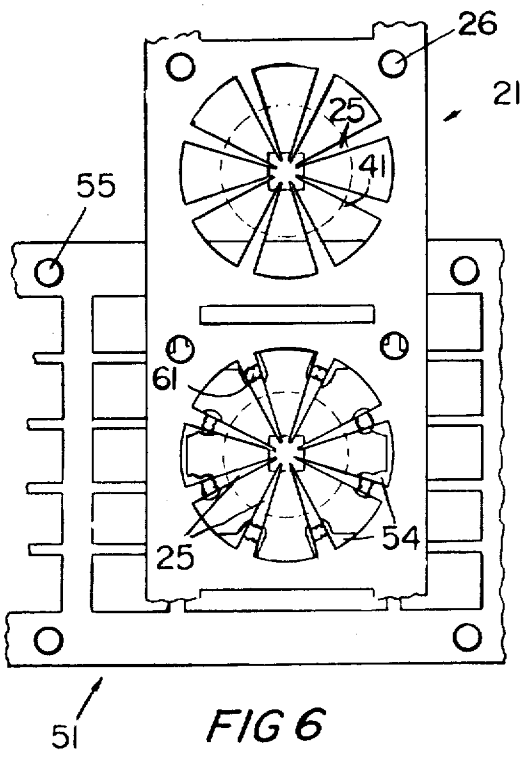

FIG. 6 is a plan view illustrating the welding of the first frame member to the lead elements of the second frame member.

Figure 7:
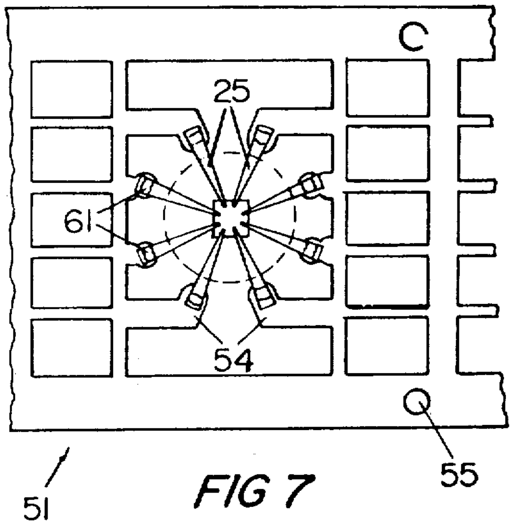

FIG. 7 is a plan view of the completed assembly, trimmed and ready for plastic encapsulation or other packaging techniques.

Figure 8:
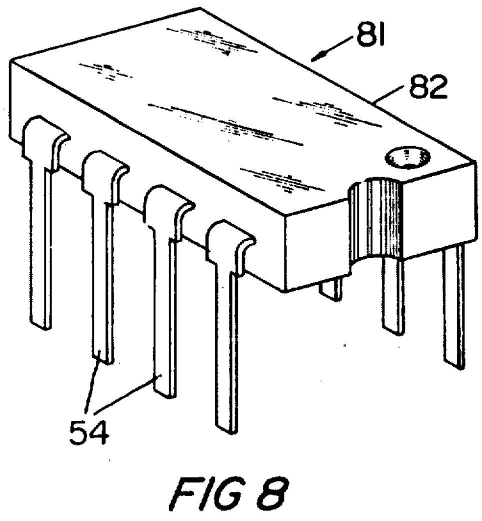

FIG. 8 is a perspective view illustrating a packaged unit wherein an assembly as shown in FIG. 7 is sealed within a plastic housing.

Figure 9:
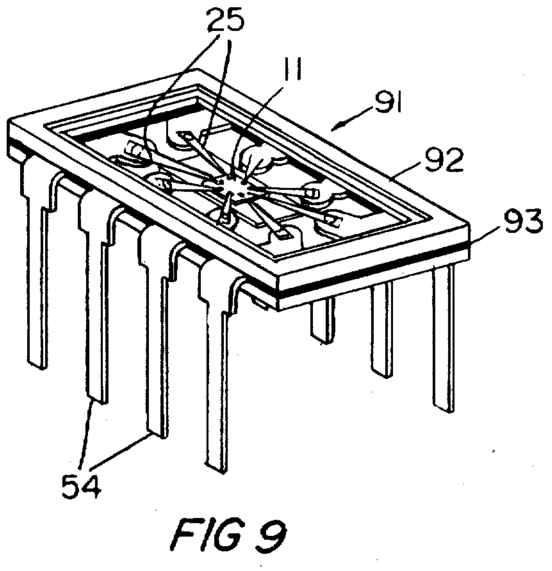

FIG. 9 is a perspective cut-away view of a hermetically sealed ceramic package illustrating another embodiment of the invention.

In FIG. 1 integrated circuit chip 11 is seen to include eight bonding pads 12 of aluminum or other suitable metal built up about 1 micron above the surrounding surface of the circuit chip. It is particularly desirable to provide coplanar bonding pads, in order to improve the reliability with which all lead ends of the first frame member are attached thereto in a single bonding step. The remaining details of the integrated circuit structure are not shown since they are not essential to the concept of the present invention.

Figure 2:
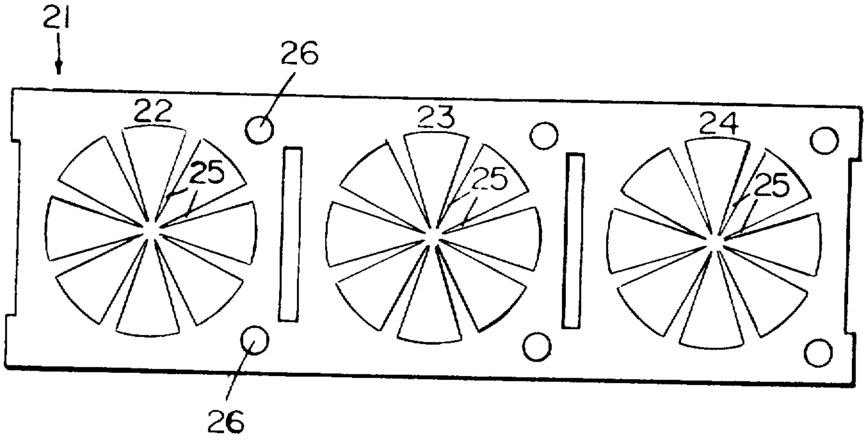
FIG. 2 is an enlarged plan view of the first lead frame member.

FIG. 2 illustrates the geometric configuration of one embodiment of the first lead frame member of the invention. Sheet metal strip 21 includes three identical lead frame sections 22, 23, and 24, each of which comprises a plurality of inwardly extending fingers of leads 25 corresponding in number to the number of bonding pads 12 of the circuit chip to be bonded thereto. Indexing holes 26 are provided to permit accurate positioning and alignment of the lead frame sections during the bonding operation in which the tips of leads 25 are attached to the bonding pads of the circuit chip.

Figure 3:
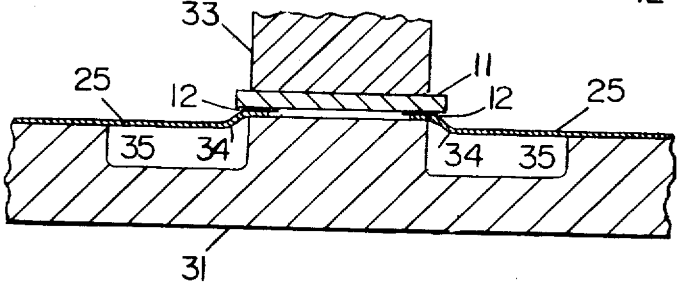

FIG. 3 illustrates the bonding of contact pads 12 with the tips of lead members 25. One lead frame section, for example, 22, is positioned on base 31 in such a manner that the ends of leads 25 are symmetrically located with respect to the center of post or pedestal 32. Circuit chip 11 is then inverted, as shown, and aligned with the ends of leads 25 such that each bonding pad 12 is placed in contact with a lead 25. A bonding needle 33 is then pressed against chip 11 and a sufficient pressure is applied, in combination with high frequency (preferably 5 to 100 kilocycles per sec.) vibratory energy to complete the formation of a suitable bond securing each pad 12 to a corresponding lead 25.

During the bonding operation, all sides of the lead frame section in 22 are laterally confined such that a slight buckling action is introduced in leads 25 due to the deformation of the ends of the leads at the bonding sites. The degree of such deformation is preferably between 25 and 50 percent. The resulting bend 34 is each of leads 25 is sufficient to avoid the danger of shorting which would result if the edges of the circuit chip came in contact with the bonded leads. An annular recess 35 is provided surrounding post 32 in order to accommodate the buckling action.

In the embodiment of FIG. 3*a*, leads 25*a* are provided with channels 36 located at the edge of die 11, as an alternate means of avoiding electrical shorts. Using this technique a modified base 31*a* can be employed, since annular recess 35 is not needed.

In FIG. 4 lead frame section 22, including the bonded die 11, is shown after separation from strip 21. In accordance with an optional feature of the invention, a rigid support 41 spanning the circuit die 11 is attached to leads 25 in order to relieve the bonding sites of excessive stress. For example, support means 41 may consist of a ceramic disc attached to the leads and to the die itself by means of a polymeric adhesive substance.

In FIG. 5 a second lead frame member is shown in the form of an elongated rectangular strip 51 composed of identical lead frame sections 52 and 53 comprising inwardly extending leads 54. Indexing holes 55 are provided for positioning the frame member, similarly as indexing holes 26 of the first lead frame member. Strip 51 is constructed of a heavier gage of sheet metal than strip 21 since the leads 54 must be adapted for external electrical connections extending from the completed unit.

In FIG. 6 the attachment of leads 25 to leads 54 is illustrated. This step is accomplished by placing strip 21 in contact with strip 51 whereby leads 25 are aligned with leads 54 in the manner shown. While the strips are so aligned, the lead members are welded or soldered to one another at points 61. The step of bonding the corresponding leads can be achieved in a single operation analogous to that illustrated in FIG. 3 for the attachment of leads 25 to bonding pads 12.

It will be apparent from the foregoing description that the combination of first and second lead frame members avoids the need for compromise which arises in any attempt to provide a single lead frame capable of serving both as connection means to external circuitry, and as internal connection means to the electrodes of an integrated circuit die.

Still further, a great reduction in tooling expense is provided since the exact configuration of the second lead frame member will not have to be changed in order to accommodate microcircuits having different sizes and shapes; or to accommodate microcircuits on which the bonding sites have different locations. Any such accommodations are readily made by providing the first lead frame with a different configuration, such that the leads thereof make the necessary connections between the die and the second lead frame. Thus any such tooling expense is limited to the first lead frame only, which, because of its smaller size and lighter weight involves much less expense.

In FIG. 7 the completed assembly is shown after the removal of the excess portions of strip 21 leaving only those segments of leads 25 which extend inwardly from welding sites 61. The completed assembly, as shown in FIG. 7, is then packaged, after which excess portions of strip 51 are removed to provide a completed unit as shown in FIG. 8. The final packaging operation is not unique to the present invention and may be carried out in accordance with any of various procedures well known in the art.

In accordance with an additional embodiment of the invention, the assembly shown in FIG. 4 may be further modified by cementing a second ceramic disc to the reverse side of the circuit die, thereby "sandwiching" the chip between two ceramic plates or discs. A preferred cement or adhesive to be used for this purpose is an epoxy resin. For some applications, the ceramic sandwich is sufficient as a complete external package. That is, the leads 25 may be severed from frame 22 to provide a finished, marketable unit consisting of die 11 and leads 25 sandwiched between two ceramic discs and sealed together by a synthetic resin adhesive.

In FIG. 9, a hermetically sealed ceramic package 91 is shown, comprising upper ceramic plate 92 in combination with a corresponding lower ceramic plate hermetically sealed together by means of glass layer 93. Leads 54 are sandwiched between the ceramic plates and embedded within glass seal 93. The remaining structure, including die 11 and leads 25, is bonded as shown in FIG. 7.

What is claimed is:

1. A method for fabricating a plurality of structures for electrical devices utilizing automated manufacturing apparatus in such fabricating to provide on the outside of each such structure a plurality of electrical connecting means from an electrical unit in the structure and with each such electrical unit having thereon a plurality of contact portions on one surface thereof to which the connecting means are electrically connected, which method comprises:

providing an elongated first member in a strip form having a plurality of conductive portions therewith arranged in a plurality of groups separated from one another over the length of said first member and with the transverse dimension of a group at the perimeter hereof defining generally the width of the elongated member but being specifically less than such width whereby to provide a frame portion outside said perimeter, the conductive portions of each said group corresponding in number to the contact portions of an electrical unit for a structure to be fabricated, each of the conductive portions of each said group having an inner portion adjacent a central area in the group and said inner end portions being spaced apart from one another at said central area and positioned in a pattern corresponding to the pattern in which the contact portions are placed on an electrical unit, with each conductive portion extending outwardly from the inner end portion to an outer portion thereof toward the perimeter of that group on said first member, bringing together an electrical unit and a group of conductive portions on the elongated first member at the central area of the group so that each inner end portion of a conductive portion in a group is in alignment with a corresponding contact portion on the electrical unit, simultaneously securing all said inner end portions of a group and said contact portions of an electrical unit together in a secure electrical and mechanical connection to provide an independent assembly which includes an electrical unit and a corresponding group of conductive portions on said first member in said strip form, providing an elongated one-piece metallic second member in a strip form having a plurality of groups of lead portions preformed therein with the lead portions of each group corresponding in number to the contact portions and to the conductive portions in an independent assembly, and with each lead portion having an inner end portion, said lead portions in a said group each having an inner end portion at a central area of the group and each lead portion extending outwardly from that central area for a predetermined length, bringing said elongated first member in strip form and said elongated second member in strip form into position with respect to one another such that an independent assembly with said first member and a single group of lead portions in said second member are stacked relative to one another, with the outer portions of the conductive portions of a group with said first member and the inner end portions of said lead portions of a group with said second member being in alignment with one another, securing together in secure electrical and mechanical connections the corresponding outer portions of the conductive portions of a group in said first member and the inner end portions of the lead portions of a group in said second member, and separating said first member and said second member by severing from said first member excess portions of the conductive portions and the frame portion in a single group which are outwardly of said electrical and mechanical connections to the lead portions of said second member group.

2. A method as defined in claim 1 wherein said first member is in one-piece and of a metal to provide a more flexible elongated member than the one-piece metallic second member.

3. A method as defined in claim 2 wherein each conductive portion in a group for said first member is unsupported at the inner end portion and integral with said first member at the outer portion and tapers in configuration inwardly from the outer portion to the inner portion of each.

4. A method for fabricating structures utilizing electrical units having a plurality of connections on the outside of each such structure electrically connected to a plurality of contact portions on an electrical unit in the structure, which method comprises, providing a first member having a plurality of conductive portions therewith arranged in a group, the conductive portions of said group corresponding in number to the contact portions of an electrical unit for a structure to be fabricated, and said first member having a portion outside the group of conductive portions which maintains said conductive portions in a predetermined pattern, each of the conductive portions of said group having an inner portion adjacent an open central area in the group and said inner end portions being spaced apart from one another at said central area and positioned in a pattern corresponding to the pattern in which the contact portions are placed on an electrical unit, with each conductive portion extending outwardly from the inner end portion to an outer portion thereof toward the outside portion for that group on said first member, bringing together an electrical unit and the group of conductive portions on said first member at the central area of the group so that each inner end portion of a conductive portion in the group is in alignment with a corresponding contact portion on the electrical unit, securing together substantially simultaneously said inner end portions of a group and said contact portions of an electrical unit in an electrical and mechanical connection to provide an independent assembly which includes an electrical unit and the conductive portions of the group on said first member, providing a second member having a plurality of lead portions in a group and having a portion of said second member outside of the group of lead portions which maintains said lead portions in a predetermined pattern, with the lead portions of the group corresponding in number to the contact portions and conductive portions in an independent assembly, said lead portions in said group each having an inner end portion at a central area of the group and each lead portion extending outwardly from that central area to said portion outside of the group, bringing said first member and said second member into position with respect to one another such that an independent assembly with said first member and the group of lead portions in said second member are stacked relative to one another, with the outer portions of the conductive portions of said first member and the inner end portions of said lead portions of said second member being in alignment with one another, securing together substantially simultaneously in electrical and mechanical connections the corresponding outer portions of the conductive portions in said first member and the inner end portions of the lead portions in said second member, and separating said first member and said second member by severing from said first member excess portions of the conductive portions and the outside portion thereof which are outwardly of said electrical and mechanical connections of the lead portions and the conductive portions to provide a fabricated structure, with the conductive portions of said first member being more flexible than the lead portions of said second member and the flexibility being such as to relieve undue stresses at the contact portions of the electrical unit in the structure.

5. A method as defined in claim 4 wherein the electrical unit is a semiconductor unit having contact portions thereon, and the first member and the second member are each capable of being handled as two independent structures, with a plurality of conductive portions and a plurality of lead portions respectively therewith.

6. A method using assembly apparatus for attaching each of a plurality of semiconductor chips to corresponding independent groups of conductive portions with a continuous strip-like member, each semiconductor chip having a plurality of contact pads located within the lateral dimensions of the chip and said continuous strip-like member being originally provided on a reel and adapted to be rewound on a reel after such attaching, which method comprises providing a flexible strip-like metal member which is originally wound on a reel, said member having a plurality of spaced apart independent electrical connector groups over the length of said member with each group comprising a plurality of conductive portions and each conductive portion having an originally unsupported inner end portion and each said group including an excess portion of the strip-like metal member outwardly of the conductive portions, positioning a portion of the metal member in the assembly apparatus, providing a plurality of such semiconductor chips, with each chip adapted to be attached to an independent group of conductive portions of said striplike member at contact pads on said chip, aligning a semiconductor chip at its contact pads with respect to corresponding inner end portions of a group of conductive portions, said inner end portions each being spaced apart from one another adjacent an open area in a predetermined pattern corresponding to the pattern in which the contact pads are placed on the semiconductor chip, maintaining in engagement with one another the contact pads on the semiconductor chip and a group of conductive portions so that each inner end portion of a conductive portion in the group is in alignment with a contact pad, attaching together by a substantially simultaneous operation said inner end portions of a group and said contact pads of a semiconductor chip in an electrical and mechanical connection within the lateral dimensions of the chip, thereby to provide an independent assembly of a semiconductor chip and the conductive portions of each group on said member, with the excess portion of the strip-like metal member for each group adapted to ultimately be removed so that the conductive portions each then serve as an independent electrical connection from a semiconductor chip contact pad, and rewinding the strip-like member with the plurality of said independent assemblies attached thereto on to a reel to provide for subsequent handling of the member on the reel, said strip-like member being sufficiently flexible so that the attachments of the contact pads to the conductive portions will not be disturbed in the rewinding operation.

7. A method utilizing assembly apparatus for attaching electrical connecting means to an electrical unit which has a plurality of contact portions on one surface thereof which comprises providing a first frame member having a plurality of inwardly extending conductive portions therewith and an end portion on each such conductive portion adapted for alignment with and attachment to a corresponding contact portion of the electrical unit, providing support means in said assembly apparatus for supporting said first frame member for an attaching operation, supporting said first frame member at a portion of said first frame member which lies outside said inwardly extending conductive portions so as to make said end portions available for attaching to said contact portions, providing two assembly means in said apparatus, each of which is separate from said support means, bringing into engagement with one another said electrical unit at said contact portions and said conductive portions at said end portions, maintaining said end portions of said conductive portions and said contact portions in said engagement by utilizing said two assembly means, applying pressure at least to one of said two assembly means, attaching substantially simultaneously said conductive portions at said end portions to said contact portions, providing an electrically conductive second frame member with an area dimension larger than the area dimension of said first frame member, said second frame member having a plurality of inwardly extending conductive portions each of which is stiffer than the conductive portions of said first frame member, positioning the second frame member relative to the first frame member with the conductive portions of the second frame member aligned with corresponding first frame member conductive portions at the outer end portions of said first frame member conductive portions, attaching said conductive portions of said first and second frame members in a substantially simultaneous attaching operation at a place where each is in engagement with one another to provide an electrical and mechanical connection therebetween, and removing excess portions of the conductive portions of said first frame member not required for electrically connecting the electrical unit to the conductive portions of the second frame member and for the purpose of separating said first and second frame members from one another outside the attaching places therefor.

8. A fabricating method utilizing fabricating equipment for making electrical connections without the use of fine wires from the multiple contact portions on a semiconductor integrated circuit unit to the outside of a device which utilizes said integrated circuit unit, said method comprising providing two frame members each having conductive portions therewith, with the area occupied by the conductive portions of the first frame member being smaller in area dimension than the area dimension of the conductive portions of the second frame member and the first frame member being of material which is more flexible than the material of the second frame member, with each said frame member being originally independent of the other and being originally capable of independent handling in practicing said fabricating method, said first frame member having a plurality of conductive portions therewith, each of which conductive portion is separated at its inner end from adjacent inner ends of said conductive portions and is provided in a pattern at said inner ends corresponding to the pattern of the contact portions on the integrated circuit unit, aligning said first frame member and semiconductor unit at said inner ends of said first frame member and said corresponding contact portions, maintaining said inner ends and said contact portions in aligned engagement, attaching substantially simultaneously, said aligned inner ends and contact portions to provide an assembly of the first frame member and an integrated circuit unit which is capable of independent handling, said second frame member having a plurality of conductive portions each of which is free at its inner end with respect to each other said inner ends, aligning the conductive portions of said first frame member at the outer end portion of each of its said conductive portions and the conductive portions of said second frame member at the inner end of each of said second frame member conductive portions, attaching in a substantially simultaneous operation said aligned conductive portions of said first and second frame members, severing from said first frame member a portion of each conductive portion thereof at a place laterally outwardly of the place of attachment of the respective conductive portions of said first and said second frame members, and severing from said second frame member excess material therefrom not needed to accomplish electrical connections from the integrated circuit unit with said conductive portions.

9. The method of claim 6 wherein the flexible striplike metal member is provided as a continuous strip having a thickness within the dimensional range of 1.5 to 4.0 mils and a tensile strength in the range of 10,000 to 24,000 p.s.i.

10. The method as defined in claim 7 wherein said first frame member is of metal which has a thickness within the dimensional range of 1.5 to 4.0 mils.

11. The method as defined in claim 8 wherein each conductive portion of said first frame member has a configuration which tapers inwardly from the outer end thereof to the inner end portion.

12. The method as defined in claim 8 wherein the fabricating equipment for practicing said method includes means for deforming and positioning each conductive portion of the first frame member adjacent the point of attachment of the conductive portion to its corresponding contact portion of the integrated circuit unit so as to position the portion of said conductive portion which is not attached to be out of contact with the integrated circuit unit.

13. The method as defined in claim 8 wherein said first frame member is of metal which has a tensile strength in the range of 10,000 to 24,000 p.s.i., and a thickness in the range of 1.5 to 4.0 mils.

14. The method as defined in claim 8 wherein each frame member is of strip configuration, the step of positioning the first frame member strip at right angles to the second frame member strip when aligning the conductive portions of each of said frame members for attaching together said conductive portions of each.

15. The method of claim 7 wherein said two assembly means in said assembly apparatus are respectively an anvil means and an attaching means, and said pressure is applied to said attaching means to attach the end of each conductive portion to a contact portion of the electrical unit.

16. The method of claim 8 wherein the attaching of an integrated circuit unit to the conductive portions of the first frame member is accomplished by applying vibratory energy to the back side of said unit while the contact portions on the front side thereof are in engagement with respective inner ends of said conductive portions.

17. A method as defined in claim 8, wherein means in the fabricating equipment acts upon the conductive portions of the first frame member substantially coincidentally with the step of attaching said conductive portions to the integrated circuit unit to position each conductive portion away from the edge of the integrated circuit unit.

18. In a method as defined in claim 6, the step of encapsulating an independent assembly of a semiconductor chip and the conductive portions of a group in the continuous strip-like member between two ceramic members which are sealed together.

19. In the fabricating method of claim 8, providing two means in said fabricating equipment for maintaining said inner ends of said conductive portions of said first frame member and said contact portions on the integrated circuit unit in said aligned engagement, and applying pressure at one of said two means for said substantially simultaneous attaching operation of said inner ends and said contact portions.

20. In a method as defined in claim 8, providing each of said two frame members as portions of two respective strips, with each said strip having a plurality of frame members therewith and each said frame member in each said strip having said conductive portions, with each of said two strips adapted for use in the practice of the fabricating method in an automated assembly line manner, and said conductive portions of each said first frame member with the first-frame-member-strip being attached respectively to a corresponding integrated circuit unit.

* * * * *

UNITED STATES PATENT OFFICE
CERTIFICATE OF CORRECTION

Patent No. 3,698,073 Dated October 17, 1972

Inventor(s) Robert W. Helda

It is certified that error appears in the above-identified patent and that said Letters Patent are hereby corrected as shown below:

In the ABSTRACT, second line from the bottom, "heremetic" should read -- hermetic -- . Column 1, line 53, "an" should read -- and -- . Column 5, line 21, "of" should read -- or --; line 48, "is" should read -- in -- .

Signed and sealed this 20th day of March 1973.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334.